United States Patent [19]
Baillargeon et al.

[11] Patent Number: 5,901,168
[45] Date of Patent: May 4, 1999

[54] ARTICLE COMPRISING AN IMPROVED QC LASER

[75] Inventors: James Nelson Baillargeon, Springfield; Federico Capasso, Westfield; Alfred Yi Cho, Summit, all of N.J.; Jerome Faist, Neuchatel, Switzerland; Claire F. Gmachl, Short Hills, N.J.; Carlo Sirtori, Paris, France; Deborah Lee Sivco, Warren, N.J.

[73] Assignee: Lucent Technologies Inc., Murray Hill, N.J.

[21] Appl. No.: 08/852,646

[22] Filed: May 7, 1997

[51] Int. Cl.$^6$ .................. H01S 3/08; H01S 3/19
[52] U.S. Cl. .................. 372/96; 372/92; 372/45
[58] Field of Search .................. 372/92, 96, 45

[56] References Cited

U.S. PATENT DOCUMENTS

| | | | |
|---|---|---|---|
| 4,257,011 | 3/1981 | Nakamura et al. | 372/96 |
| 5,457,709 | 10/1995 | Capasso et al. | 372/45 |
| 5,502,787 | 3/1996 | Capasso et al. | 385/123 |
| 5,509,025 | 4/1996 | Capasso et al. | 372/45 |

FOREIGN PATENT DOCUMENTS

0676839A1  10/1995  European Pat. Off. .......... H01S 3/18

OTHER PUBLICATIONS

"High Power Mid-infrared ($\lambda \sim 5$ μm) Quantum Cascade Lasers Operating Above Room Temperature", by J. Jaist et al., *Applied Physics Letters*, vol. 68 (26), Jun. 24, 1996, pp. 3680–3682.

"Mid–Infrared (8.5 μm) Semiconductor Lasers Operating at Room Temperature", by C. Sirtori, *IEEE Photonics Technology Letters*, vol. 9, No. 3, Mar. 1997, pp. 294–296.

"Performance Comparison of Gain–Coupled and Index–Coupled DFB Semiconductor Lasers", by A. J. Lowery, *IEEE Journal of Quantum Electronics*, vol. 30, No. 9, Sep. 1994, pp. 2051–2063.

(List continued on next page.)

*Primary Examiner*—Rodney Bovernick
*Assistant Examiner*—Quyen Phan Leung
*Attorney, Agent, or Firm*—Eugen E. Pacher

[57] ABSTRACT

It has been found that previously known quantum cascade (QC) lasers have a shortcoming that substantially decreases their usefulness as radiation sources for pollution monitoring and other potential applications that involve absorption measurements. Except at cryogenic temperatures, these lasers have to be driven in pulse mode and are inherently multimode. We have now established that this shortcoming can be overcome by provision of appropriate distributed feedback. Resulting lasers (QC-DFB lasers) can have single mode mid-IR output at or near room temperature, can have significant optical power, and be continuously tunable over a significant spectral region.

11 Claims, 4 Drawing Sheets

OTHER PUBLICATIONS

"New Complex–coupled DFB–laser with a Contacted Surface Grating for $\lambda=1.55$ µm", by A. Rast et al., *IEE Proc.–Optoelectron*, vol. 142, No. 3, Jun. 1995, pp. 162–164.

"Single–mode and Single–beam Emission from Surface Emitting Laser Diodes Based on Surface–mode Emission", by A. Kock, *Applied Physics Letters*, vol. 69 (24), Dec. 9, 1996, pp. 3638–3640.

US Patent Application, titled "Article Comprising An Electric Field–Tunable Semiconductor Laser", filed Mar. 27, 1997 by Capasso et al.

US Patent Application, titled "Quantum Cascade Laser", filed Apr. 29, 1997 by Capasso et al.

Patent Abstracts of Japan, vol. 012, No. 458 (P–794), Dec. 2, 1988 & JP 63 182550 A (Fujitsu Ltd.), Jul. 27, 1988 (abstract).

Lowery, A.J. et al., "Performance Comparison of Gain–Coupled and Index–Coupled DFB Semiconductor Lasers", IEEE J. of Quantum Electronics, vol. 30, No. 9, Sep. 1, 1994, pp. 2051–2063, XP000462134.

Sirtori, E. et al., "Mid–Infrared (8.5 µm) Semiconductor Lasers Operating at Room Temperature", IEEE Photonics Technology Letters, vol. 9, No. 3, Mar. 1997, pp. 294–296, XP000684396.

Rast, A. et al., "New Complex–Coupled DFB–Laser With A Contacted Surface Grating for $\lambda=1.55$ µm", IEE Procedings Optoelectronics, vol. 142, No. 3, Jun. 1, 1995, pp. 162–164, XP000520441.

Kastalsky, A., "Infrared Intraband Laser Induced In A Multiple–Quantum–Well Interband Laser", IEEE J. of Quantum Electronics, vol. 29, No. 4, Apr. 1, 1993 pp. 1112–1115, XP000368637.

Li, G. P. et al., "16–Wavelength Gain–Coupled DFB Laser Array With Fine Tunability", IEEE Photonics Technology Letters, vol. 8, No. 1, Jan. 1, 1996, pp. 22–24, XP000547522.

Faist, J. et al., "Distributed Feedback Quantum Cascade Lasers", Applied Physics Letters, vol. 70, No. 20, May 19, 1997, pp. 2670–2672, XP000694785.

Hapanowicz, R., "FT–IR Spectrometers Profile Optoelectronic Emitters", Laser Focus World, vol. 32, No. 7, Jul. 1996, pp. 65–74, XP002064621.

ARTICLE COMPRISING AN IMPROVED QC LASER

GOVERNMENT CONTRACT

This invention was made with Government support under Contract DAAH04-96C-0026. The Government has certain rights in this invention.

FIELD OF THE INVENTION

This invention pertains to quantum cascade (QC) lasers, and to apparatus and systems that comprise a QC laser.

BACKGROUND

Recently a new class of semiconductor lasers, designated "quantum cascade" or "QC" lasers, was discovered. See, for instance, U.S. Pat. Nos. 5,457,709 and 5,509,025, U.S. patent application Ser. No. 08/825,286, titled "Article Comprising An Electric Field-Tunable Semiconductor Laser", filed Mar. 27, 1997 by Capasso et al., and U.S. patent application Ser. No 08/841,059, titled "Quantum Cascade Laser", filed Apr. 29, 1997 by Capasso et al., all incorporated herein by reference.

QC lasers are unipolar lasers that can be designed to emit radiation at substantially any desired wavelength in a rather wide spectral region. Specifically, they can be designed to emit in the mid-infrared (mid-IR), a spectral region in which there are few convenient radiation sources.

It is known that absorption lines of many target gases and environmental pollutants lie in the mid-IR spectral region, e.g., between about 3 and 13 µm. This suggests that QC lasers could be advantageously used as radiation sources for absorption spectroscopy of such gases and pollutants, e.g., for emission monitoring or process control. Such use would be especially desirable because at least some QC lasers can operate in the relevant wavelength region at or near room temperature and with relatively high output power. See, for instance, J. Faist et al., *Applied Physics Letters*, Vol. 68, pp. 3680–3682 (1996); and C. Sirtori et al., *IEEE Photonic Technology Letters*, Vol. 9, pp. 294–296 (1997), both incorporated herein by reference.

However, we have come to realize that prior art QC lasers have a shortcoming that substantially decreases their usefulness as radiation sources for absorption spectroscopy and other applications. The shortcoming will be discussed below.

A "quantum cascade" or "QC" laser herein is a unipolar semiconductor laser having a multilayer structure that forms an optical waveguide, including a core region of relatively large effective refractive index between cladding regions of relatively small effective refractive index. A cladding region will also be referred to as a "confinement region". The core region comprises a multiplicity of nominally identical repeat units, with each repeat unit comprising an active region and a carrier injector region. The active region has a layer structure selected to provide an upper and a lower carrier energy state, and such that a carrier transition from the upper to the lower energy state results in emission of a photon of wavelength $\lambda$. The carrier injector region has a layer structure selected to facilitate carrier transport from the lower energy state of the active region of a given repeat unit to the upper energy state of the active region of the adjacent (downstream) repeat unit. A carrier thus undergoes successive transitions from an upper to a lower energy state as the carrier moves through the layer structure, resulting in the creation of a multiplicity of photons of wavelength $\lambda$. The photon energy (and thus $\lambda$) depends on the structural and compositional details of the repeat units.

SUMMARY OF THE INVENTION

We have come to realize that prior art QC lasers have a shortcoming that makes problematical their use as source of mid-IR radiation for pollution monitoring and other potential applications that involve absorption measurements. Specifically, prior art QC lasers that can be operated at or near room temperature typically have to be driven in pulsed mode and are inherently multimode. Single mode emission from QC lasers has so far only been achieved in continuous wave (CW) operation at cryogenic temperatures ($\leq$140K). However, for many if not all of the envisaged absorption-type measurement applications, single mode emission is a requirement. Thus, the art needs a QC laser capable of single mode emission of mid-IR radiation, above cryogenic temperatures (e.g., >140K, preferably >200K such that Peltier cooling can be used), preferably still at or near room temperature. It would also be desirable if the QC laser could provide significant output power, exemplarily 1 mW or more. Operation above cryogenic temperatures obviously would be simpler, less expensive and more suitable for field use, and substantial output power for instance translates into the ability to use cheaper, less sophisticated detection equipment. Furthermore, it would be especially desirable if the single mode laser emission were continuously tunable over a significant wavelength region. This application discloses such QC lasers.

We have recognized that provision of appropriate distributed feedback to a QC laser could facilitate pulsed single mode laser operation at or near room temperature. To the best of our knowledge, there is nothing in the prior art that teaches or suggests a QC laser with distributed feedback, that is to say, a QC-DFB laser.

Of course, diode lasers with distributed feedback structures are well known. See, for instance, A. J. Lowery et al., *IEEE Journal of Quantum Electronics*, Vol. 30 (9), p. 2051 (1994). See also A. Rast et al., *IEEE Proceedings-Optoelectronics*, Vol. 142 (3), p. 162 (1995), and A. Köck et al., *Applied Physics Letters*, Vol. 69 (24), p. 3638 (December 1996), which respectively disclose a bipolar complex-coupled DFB laser diode with a surface grating and a surface bipolar emitting laser diode with a grating in the top-cladding layer, the grating facilitating coupling of the laser mode to a surface mode.

Our invention is embodied in an article (e.g., an absorption spectroscopy system) that comprises a QC laser. The QC laser comprises a first and a second cladding region, with a core region therebetween, and further comprises electrical contacts selected to facilitate flowing an electrical current through the laser. The core region comprises a multiplicity (e.g., 10 or more, typically more than 20) of essentially identical multilayer semiconductor repeat units selected for lasing at a wavelength $\lambda$ (typically in the mid-IR).

Significantly, the QC laser further comprises at least one grating structure for providing distributed feedback, the grating structure spaced from the core region such that electromagnetic radiation in a confined laser mode has non-zero intensity (e.g., 0.1% or more of the peak intensity of the mode) at the grating structure, with the structure selected to facilitate single mode laser operation.

Repeat units herein are essentially identical if the repeat units are nominally identical, with any differences between repeat units being due to, typically unavoidable, unintended variations during device manufacture.

DETAILED DESCRIPTION OF EXEMPLARY EMBODIMENTS

Figure 1:
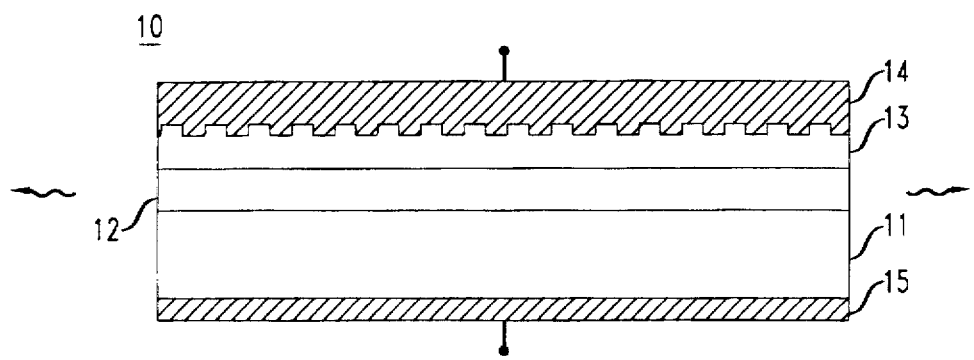
FIG. 1 schematically shows a complex-coupled QC-DFB laser according to the invention.

Radiation sources for applications such as remote chemical sensing and pollution monitoring desirably have a linewidth that is narrower than the pressure-broadened absorption linewidth of the relevant gases at room temperature, typically about one wavenumber, and desirably are tunable over a few wavenumbers. The required narrow linewidths generally can not be attained above cryogenic temperatures with prior art QC lasers. We will now describe novel QC lasers that can meet the linewidth and tuning requirements at user-friendly temperatures, e.g., above 200K.

In a first embodiment the novel laser had a layer structure, substantially as described in U.S. Pat. No. 5,509,025 and J. Faist et al., *Applied Physics Letters*, Vol. 68, pp. 3680–3682 (1996), dimensioned for operation at about 5.4 μm. The layer structure is shown in Table I, and the layer sequence of the active region (29 repeat units) is described in the above cited paper by Faist et al. The layer structure was grown lattice-matched on an n-doped InP substrate by MBE, and included a MBE-grown InP top cladding for optimal heat dissipation. The heavily doped top InP layer served as plasmon-confining layer. See U.S. Pat. No. 5,502,787.

TABLE I

| Composition | Doping | Thickness |
|---|---|---|
| InP | n = 7 × 10$^{18}$ cm$^{-3}$ | 900 nm |
| InP | 2 × 10$^{17}$ | 1300 |
| InP | 5 × 10$^{17}$ | 20 |
| Graded | 2 × 10$^{17}$ | 30 |
| InGaAs | 1 × 10$^{17}$ | 200 |
| Active region + Injector (29×) | | 1310 |
| InGaAs | 1 × 10$^{17}$ | 150 |
| Graded | 2 × 10$^{17}$ | 25 |
| InP substrate | 2 × 10$^{17}$ | |

It is known that in lasers with distributed feedback, the coupling constant κ quantifies the amount of coupling between the forward and backward waves traveling in the cavity. The coupling constant can be written as $$\kappa = \pi n_1 \lambda_B^{-1} + i\alpha_1/2,$$

where $n_1$ is the amplitude of the periodic modulation of the real part of the effective refractive index ($n_{eff}$) of the mode, due to the presence of a grating of period Λ, $\alpha_1$ is the amplitude of the corresponding modulation of the absorption coefficient, $\lambda_B$ is a wavelength determined by the Bragg condition $\lambda_B = 2n_{eff}\Lambda$ (for a first order grating), and i is the imaginary unit.

For optimal performance with respect to threshold current and slope efficiency, the quantity |κL| desirably is about 1, where L is the laser cavity length, and where the vertical bars indicate the absolute value. For L~2–3 mm, the laser desirably is designed such that |κ|~5 cm$^{-1}$. This corresponds to $n_1$~10$^{-3}$ for an index-coupled device or $\alpha_1$~2.5 cm$^{-1}$ for a loss-coupled device.

In order to provide distributed feedback, we formed a first order grating (Λ=850 nm) in the top InP layer. We used conventional contact photolithography and wet chemical etching selected to yield a desired grating depth, exemplarily about 250 nm. In the grating region, the thickness of the heavily doped plasmon-confining layer (900 nm thick InP, see Table I) is periodically reduced, and the guided mode interacts more strongly with the metal contact that is formed on the grating, locally increasing the loss. Consequently the coupling constant is expected to be complex, with estimated $n_1$~5×10$^{-4}$ and estimated $\alpha_1$~0.5–2.0 cm$^{-1}$. The presence of complex coupling advantageously lifts the degeneracy between the two modes on each side of the Bragg stopband.

FIG. 1 schematically shows an exemplary complex-coupled QC-DFB laser 10 according to the invention. Numerals 11–13 refer to the lower confinement region, the QC active region (exemplarily 29 repeat units), and the upper confinement region, with a grating on the top surface. Numerals 14 and 15 refer to metallization layers. The wavy arrows indicate output radiation.

The lasers were processed in conventional fashion into ridge mesa waveguides of width 8–14 μm, and cleaved into bars of length 0.75–3.0 mm, with the facets left uncoated. Subsequently the lasers were mounted, substrate down, on the temperature-controlled (10–320K) cold head of a He flow cryostat. Measurements were made, with the lasers driven by 10–50 ns current pulses with 4.5 kHz repetition rate.

Figure 2:
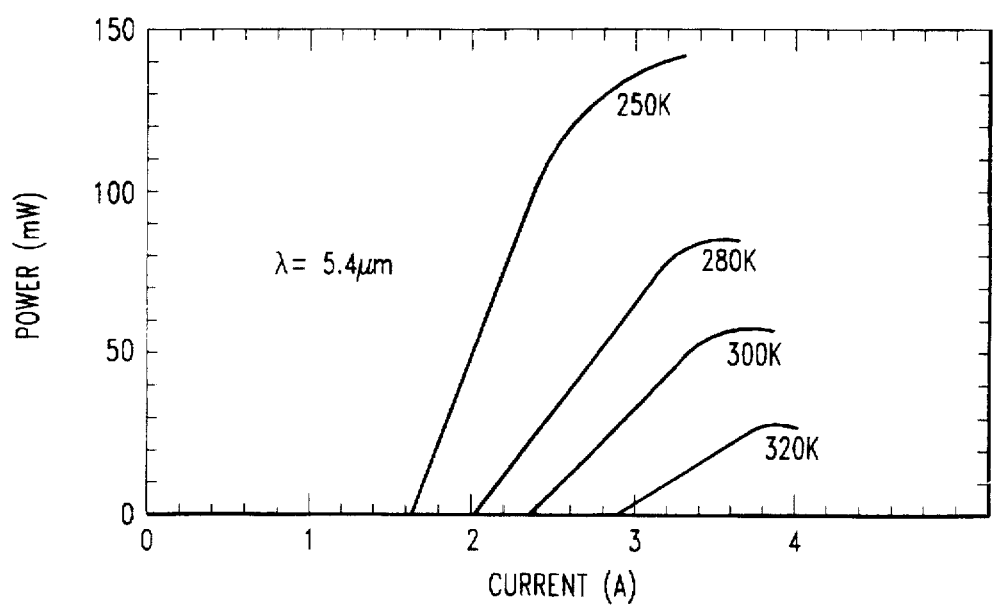
FIG. 2 shows L-I characteristics of an exemplary 5.4 μm QC-DFB laser.

FIG. 2 shows laser output vs. current (L-I) characteristics of an exemplary 3 mm long laser according to the invention. The laser exhibited single mode operation from 324K down to about 260K, where a second mode appeared, and had output power >50 mW at 300K. The wavelength was 5.4 μm.

Figure 3:
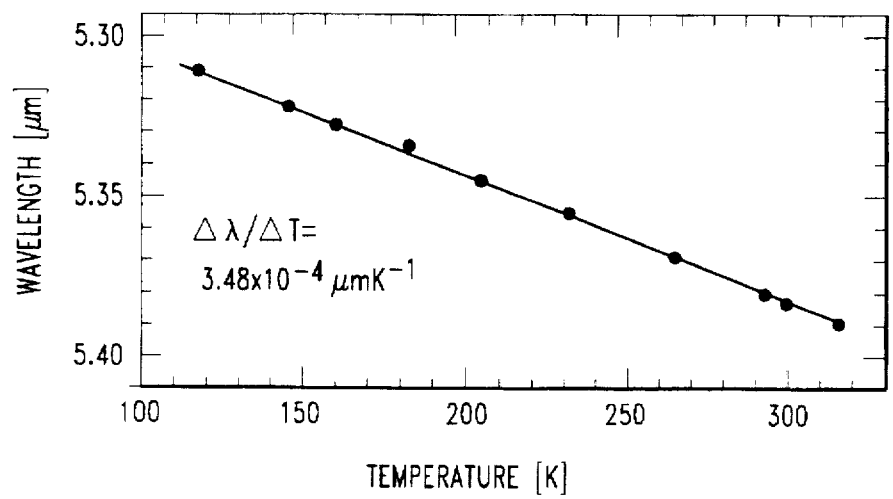
FIG. 3 shows wavelength vs. temperature data of the above exemplary laser.

FIG. 3 shows data on wavelength vs. temperature of an exemplary 5.4 μm laser. The output frequency could be tuned over a wide range, approximately 700 GHz, the linewidth being about 500 MHz. The output was single mode over substantially all of the temperature range that is accessible with a thermoelectric cooler (~200–320K and even higher).

All the 5.4 μm devices tested (~10) showed single-mode operation at temperatures where the location of the maximum of the gain curve substantially matched the Bragg condition. In particular, operation on two modes on each side of the stopband was never observed. We attribute this advantageous single-mode behavior to the presence of loss component $\alpha_1$ that lifts the degeneracy between these two modes, and to the low radiative efficiency of the intersubband transition which efficiently suppresses non-lasing modes. By way of example, lasers as short as 500 μm lased on a single mode.

Control samples without grating exhibited multimode performance comparable to that of prior art QC lasers.

Figure 4:
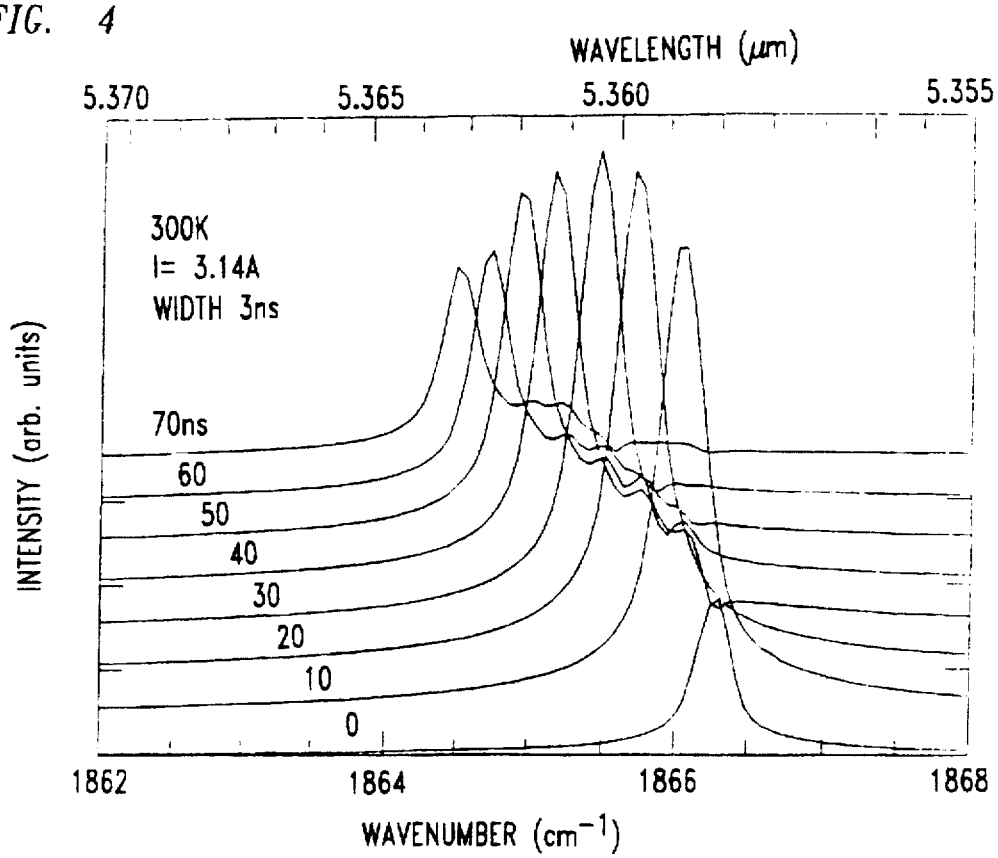
FIG. 4 shows a time-resolved spectrum of an exemplary laser according to the invention.

At room temperature (e.g., 300K) the lasers according to the invention typically dissipated too much power for continuous wave (CW) operation. For very short current pulses (e.g., 5–10 ns) the spectra of the lasers were very narrow, limited by spectrometer resolution (0.125 cm$^{-1}$). For longer current pulses (e.g., 100 ns) the output spectrum was wider (~1 cm$^{-1}$). We made time-resolved measurements that established that the lasers kept a narrow emission line, which drifted with time at the rate of 0.03 cm$^{-1}$/ns. It will be appreciated that the exact value of the rate depends on experimental conditions. FIG. 4 shows an exemplary time-resolved spectrum.

Table II shows the layer structure of a further laser according to the invention. The core region of the laser contains 40 repeat units of the previously described type, but scaled in energy to obtain emission wavelength of about 7.8 μm. Specifically, the thicknesses (in nm) of the layers of one repeat unit, from top to bottom, and starting from the injection barrier, are:

(4.0)/2.0/(1.0)/7.4/(1.3)/5.4/(2.4)/4.4/(1.4)/3.6/(1.2)/3.6/(1.7)/3.9. Barrier layer thicknesses are in parentheses, and the underlined two thicknesses correspond to Si doped layers (n=2.5×10$^{17}$ cm$^{-3}$). The compositions of barriers and wells are $Al_{0.48}In_{0.52}As$ and $Ga_{0.47}In_{0.53}As$, respectively.

TABLE II

| Composition | Doping | Thickness |
|---|---|---|
| InGaAs | n = 1 × 10$^{20}$ cm$^{-3}$ | 10 nm |
| Graded | 7 × 10$^{18}$ | 30 |
| AlInAs | 7 × 10$^{18}$ | 600 |
| AlInAs | 3 × 10$^{17}$ | 1000 |
| AlInAs | 2 × 10$^{17}$ | 1000 |
| Graded | 2 × 10$^{17}$ | 30 |
| InGaAs | 1 × 10$^{17}$ | 200 |
| Active region + Injector (40×) | | 1730 |
| InGaAs | 1 × 10$^{17}$ | 300 |
| Graded | 2 × 10$^{17}$ | 25 |
| InP substrate | 1 × 10$^{17}$ | |

Figure 5:
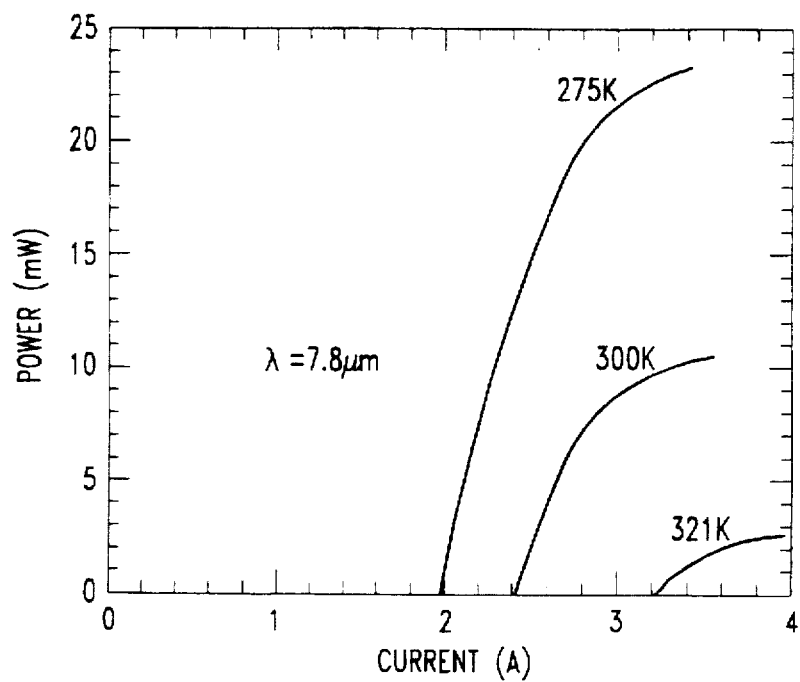
FIG. 5 shows L-I characteristics of a further exemplary QC-DFB laser according to the invention.
Figure 6:
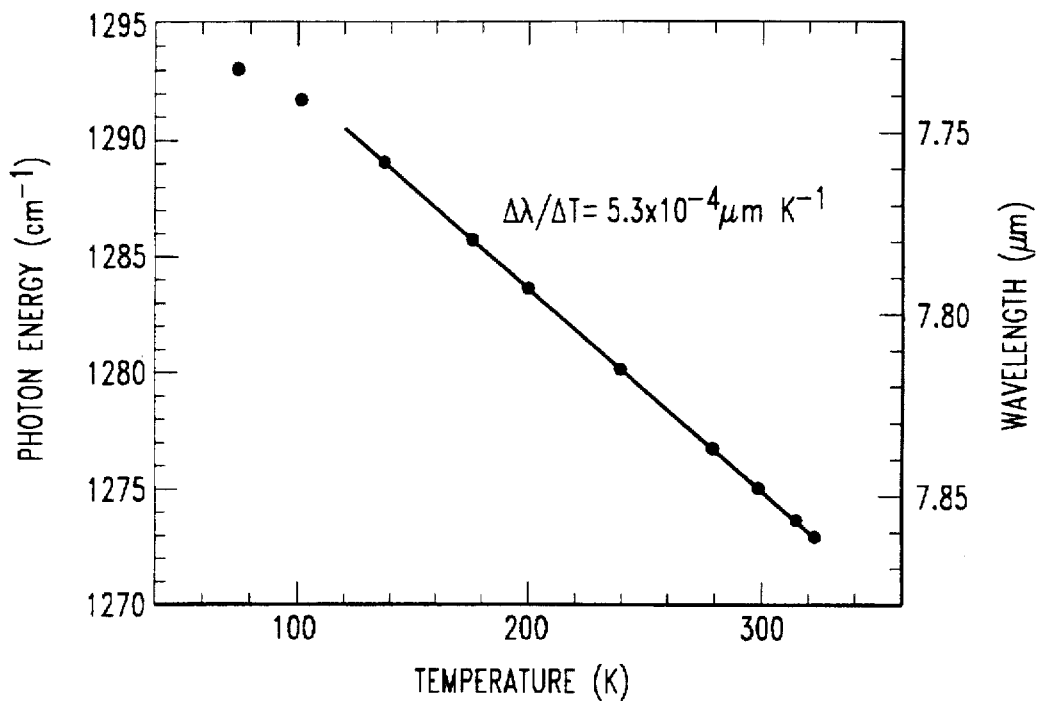
FIG. 6 shows photon energy/wavelength vs. temperature of the laser of FIG. 5.

A grating (Λ=1250 nm) was formed by etching through the top InGaAs and graded layers into the heavily doped plasmon-confining layer (600 nm AlInAs), substantially as described, and the wafer was metallized in conventional fashion. The wafer was processed into ridge mesa waveguides and cleaved into bars, all substantially as described. Measurements were made substantially as with the previously described laser. Specifically, we determined the L-I curve of a 2.25 mm long laser, using f/0.8 optics and a calibrated, room temperature HgCdTe detector. Exemplary results are shown in FIG. 5. We made spectral measurements made with a Fourier Transform Infrared Spectrometer with maximum resolution 0.125 cm$^{-1}$. The observed spectrum was single-mode, with no observable side lobes in the temperature range 80–315K. The laser was continuously wavelength tunable from λ=7.78 μm to λ=7.93 μm by changing the operating temperature from 80–315K. The tuning mainly is due to the change of the refractive index with temperature of the bulk constituents of the laser. FIG. 6 shows exemplary data on photon energy/wavelength as a function of temperature.

Table III shows the layer structure of a still further embodiment of the invention, namely, a QC-DFB laser with a grating in the top confinement layer, close to the active region. The coupling constant was complex and index-dominated. The layer structure was designed for emission wavelength of about 5.4 μm. Manufacture of the layer structure involved two MBE growths. In the first growth the core region was formed. It comprises a thin (400 nm) lower InGaAs layer, 25 repeat units, and an upper InGaAs layer. Each repeat unit comprises a three-well vertical transition region and an n-doped electron injector. The transition region is designed for high temperature laser operation, substantially as described in J. Faist et al., *Applied Physics Letters*, Vol. 68, pp. 3680–3682 (1996. Specifically, the layer thicknesses from top to bottom of one repeat unit were (in nm)

(5.0)/0.9/(1.5)/4.7/(2.2)/4.0/(3.0)/2.3/(2.3)/2.2/(2.2)/2.0/(2.0)/2.0/(2.3)/1.9/(2.8)/1.9. The thicknesses in parentheses refer to the barrier layers ($Al_{0.48}In_{0.52}As$). The wells were of composition $Ga_{0.47}In_{0.53}As$. In the above sequence, the first barrier thickness pertains to the injection barrier, and the following six thicknesses pertain to the active region of the repeat unit.

In the above described exemplary embodiment the grating was formed in the top confinement layer. At least in principle it could be formed in the lower confinement layer.

TABLE III

| Composition | Doping | Thickness |
|---|---|---|
| InP | n ~ 7 × 10$^{18}$ cm$^{-3}$ | 1300 nm |
| InP | 2 × 10$^{17}$ | 1500 |
| InP | 5 × 10$^{17}$ | 20 |
| InGaAs | 3 × 10$^{17}$ | 200 |
| InGaAs | 1 × 10$^{17}$ | 300 |
| Active regions and injectors (25×) | | 1170 |
| InGaAs | 1 × 10$^{17}$ | 400 |
| Graded | 2 × 10$^{17}$ | 25 |
| InP | 2 × 10$^{17}$ | substrate |

As can be seen from Table III, the core region of the layer structure comprises, in addition to the active regions and injectors, a lower and an upper InGaAs layer. These layers (also present in the lasers of Tables I and II) serve to improve the confinement of the optical mode. The upper InGaAs layer also serves as the host layer for the grating.

After completion of the first MBE growth, the grating with period Λ=850 nm was formed by conventional contact lithography and wet chemical etching in the upper InGaAs layer. In the second MBE growth, InP was directly grown on the grating. The grating strength is controlled by the grating depth and duty-cycle during etching and the reflow of material during the re-growth procedure.

After completion of the second MBE growth all samples were processed into deep mesa-etched, 8–14 μm wide ridge waveguide lasers, cleaved into bars with lengths from 1.5 to 3.0 mm, and the facets left uncoated. Subsequently, measurements were made substantially as described above.

Figure 7:
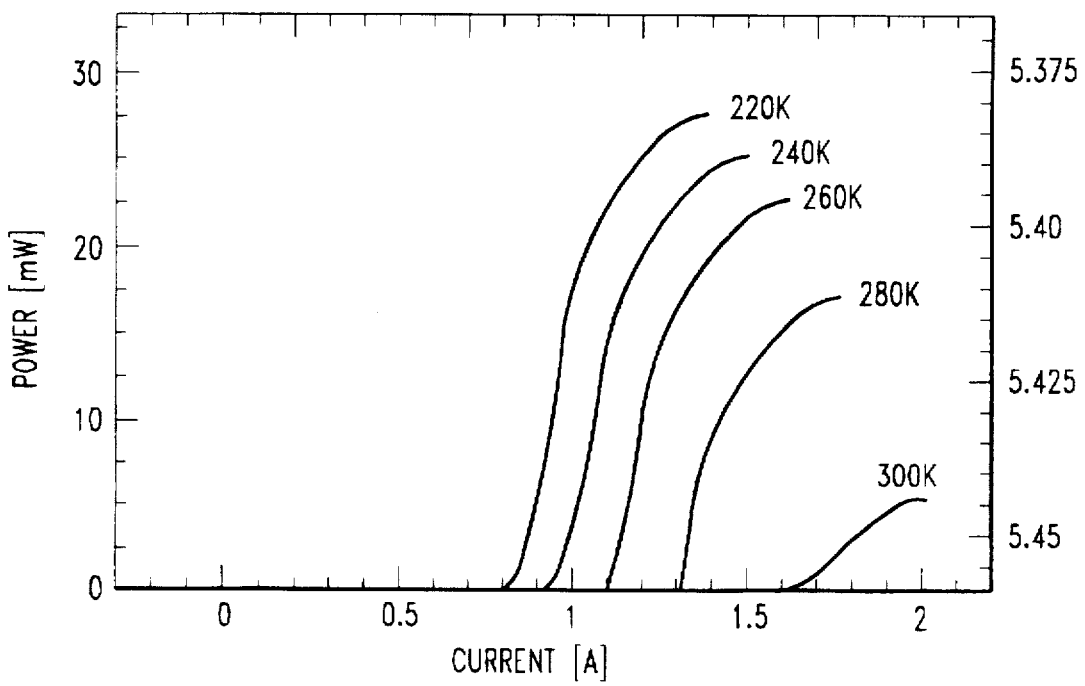
FIG. 7 shows L-I characteristics of a still further exemplary QC-DFB laser according to the invention.

FIG. 7 shows the L-I characteristics of an exemplary (1.5 mm long, substantially index-coupled) QC-DFB laser as described above. From our measurement results it is clear that the grating provides strong feedback and improves device performance, as compared to otherwise identical devices without grating.

Figure 8:
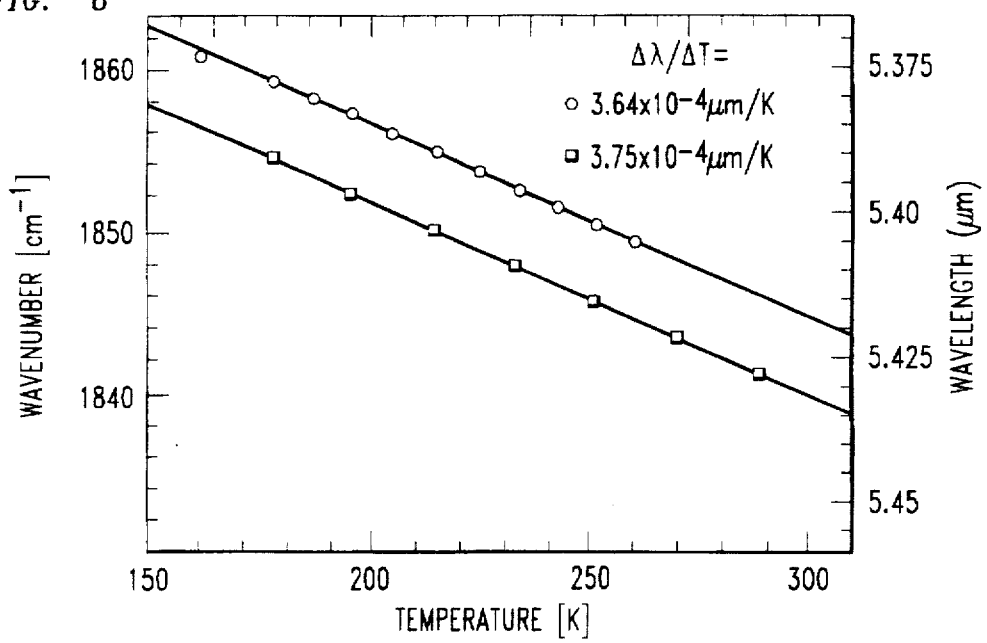
FIG. 8 shows photon energy/wavelength vs. temperature of exemplary QC-DFB lasers.

FIG. 8 shows the tuning behavior of two exemplary 1.5 mm long substantially index-coupled lasers according to the invention. Otherwise identical lasers without grating showed a broadband, multiple-mode Fabry-Perot spectrum, whereas the lasers according to the invention were single mode, with side-mode suppression ratio better than about 30 dB.

Single mode high power output was also obtained from a QC-DFB laser according to the invention that utilized electron transitions from an upper miniband to a lower miniband, substantially as disclosed in above referenced U.S. patent application Ser. No. 08/841,059 of Apr. 29, 1997 by Capasso et al.

Lasers according to the invention have properties that will, we believe, make them useful in many applications, including applications that currently utilize lead salt lasers. By way of example, lasers according to the invention can be advantageously used for trace gas analysis, e.g., for environmental applications, automotive emission sensors, combustion diagnostics, industrial process control, medical applications or collision avoidance radar for aircraft or automobiles.

In general, QC-DFB lasers can advantageously be used in point sensing apparatus as well as in remote sensing apparatus.

Figure 9:
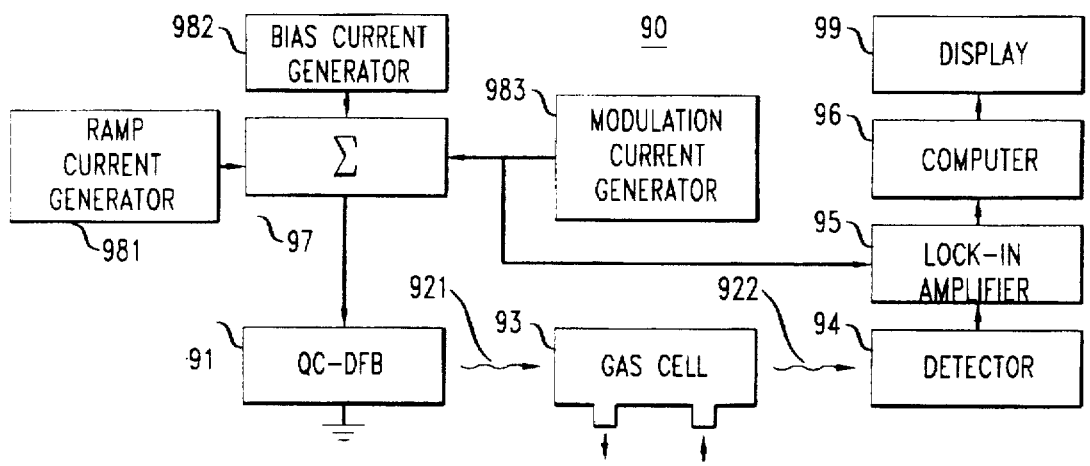
FIGS. 9 and 10 schematically depict exemplary apparatus that comprises QC-DFB lasers according to the invention.

FIG. 9 schematically depicts exemplary point sensing apparatus 90, wherein numeral 91 refers to a QC-DFB laser according to the invention. Typically the laser is mounted on a temperature-controlled stage (not shown) for coarse wavelength tuning. Mid-IR radiation 921 from the laser passes through conventional gas cell 93 (optionally a multi-pass cell), with exited radiation 922 impinging on conventional detector 94. The electrical output of the detector is supplied to lock-in amplifier 95 (together with an appropriate modulation signal, e.g., a 1.2 kHz sine wave from modulation signal generator 983), and the lock-in amplifier output is supplied to computer 96 for data analysis and formatting. The data is then displayed and/or stored in any suitable manner. The QC-DFB laser is pumped with an appropriate electrical current. For instance, a low frequency current ramp (e.g., 250 ms period) from ramp current generator 981, short bias pulses (e.g., 5 ns pulse width, 2 μs period) from bias current generator 982, and a modulation signal from modulation current generator 983 are supplied to combiner 93, and the resultant current ramp with superimposed current pulses and sine wave is applied to the laser. The current ramp serves to sweep the laser temperature over a predetermined range, and the pulses cause the emission of short laser pulses. The pulse wavelength is slowly swept over a range of wavelengths, and absorption as a function of wavelength is determined. Thus, the presence in the cell of a gas that has an absorption line in the range of wavelengths is readily detected, and the gas can be identified. As those skilled in the art will recognize, some conventional features are not shown in FIG. 9. For instance, the measurement set-up will typically be under computer control, requiring further inputs to, and outputs from, the computer.

Figure 10:
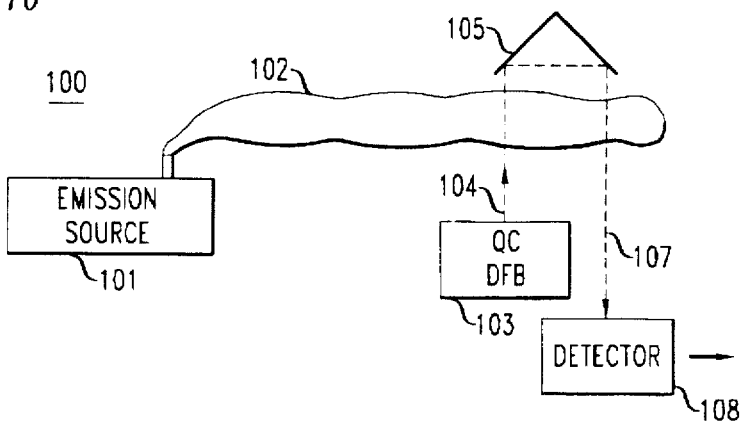

FIG. 10 schematically depicts an exemplary remote-sensing system 100, wherein emission source 101 (e.g., a factory) emits gaseous emission cloud 102. QC-DFB laser 103 emits mid-IR radiation 104 which propagates through the emission cloud, and is reflected (e.g., by means of a corner reflector 105). Reflected radiation 107 then is detected by means of detector 108. The laser can be pumped in any appropriate manner, e.g., as described in conjunction with FIG. 9, and the detector output can be utilized in any appropriate manner, e.g., also as described above. A mirror or other appropriate reflector can be used instead of corner reflector 105. The reflector can be on an aircraft or any elevated feature, including the smoke stack that is being monitored. Of course, the detector could also be on an aircraft, or be on an elevated feature. In general, any arrangement that results in a line-of-sight disposition of laser and detector is contemplated.

The QC-DFB laser will generally be mounted in an appropriate housing for protection and control. The package will typically comprise cooling means (e.g., water cooling, thermoelectric cooling), temperature sensor means (e.g., a thermocouple) for use in a feedback loop for temperature control, and means for applying the pump current to the laser. The laser is attached in conventional fashion to the cooling means. Optionally the housing may also contain detector means for controlling laser output power. The housing will typically have a window that is transparent for the laser radiation, and will typically be evacuated or filled with inert gas.

The invention claimed is:

1. An article comprising a unipolar semiconductor laser having a multilayer structure that forms an optical waveguide, including a core region of relatively large effective refractive index between cladding regions of relatively small effective refractive index, the core region comprising a multiplicity of nominally identical repeat units, with each repeat unit comprising an active region and a carrier injection region, the active region having a layer structure selected to provide an upper and a lower carrier energy state, and such that a carrier transition from the upper to the lower energy state results in emission of a photon of wavelength $\lambda$, the carrier injection region having a layer structure selected to facilitate carrier transport from the lower energy state of the active region of a given repeat unit to the upper energy state of the active region of an adjacent downstream repeat unit, said unipolar semiconductor laser to be referred to as a quantum cascade laser; the quantum cascade laser further comprises electrical contacts selected to facilitate flowing an electric current through the laser;

characterized in that the quantum cascade laser further comprises at least one grating structure for providing distributed feedback, the grating structure spaced from the core region such that electromagnetic radiation in a confined laser mode has non-zero intensity at the grating structure, with the grating structure selected to facilitate emission of single mode laser radiation.

2. Article according to claim 1, wherein the grating structure is a grating of constant periodicity $\Lambda$.

3. Article according to claim 1, wherein the grating structure is disposed between the core region and an upper one of said electrical contacts.

4. Article according to claim 3, wherein the grating structure is disposed such that a coupling constant $\kappa$ is a complex coupling constant.

5. Article according to claim 3, wherein the grating structure is disposed such that a coupling constant $\kappa$ is an index dominated coupling constant.

6. Article according to claim 1, wherein the article is a measurement system for measuring infrared radiation absorption by a measurement species, wherein the measurement system comprises a source of single mode infrared laser radiation comprising a) the quantum cascade laser of claim 1; and b) a detector for detecting the single mode infrared laser radiation after passage thereof through a quantity of said measurement species.

7. Measurement system according to claim 6, wherein said measurement species is a gas disposed in a measurement cell.

8. Measurement system according to claim 6, wherein said measurement species is an unconfined gas.

9. Article according to claim 1, further comprising a current source connected to said electrical contacts, said current source providing a laser-heating current to the laser such that the wavelength of the single mode laser radiation varies in accordance with the laser-heating current.

10. Article according to claim 9, wherein said laser-heating current comprises a current ramp of duration much greater than the duration of concurrently applied current pulses.

11. Article according to claim 1, wherein said single mode laser radiation has wavelength in the approximate spectral range 3–13 μm.

* * * * *